United States Patent
Chen et al.

(10) Patent No.: US 9,960,738 B1
(45) Date of Patent: May 1, 2018

(54) PEAKING AMPLIFIER FREQUENCY TUNING

(71) Applicant: GLOBALFOUNDRIES Inc., Grand Cayman (KY)

(72) Inventors: Michael Chen, Raleigh, NC (US); Steven M. Clements, Raleigh, NC (US); Mohak Chhabra, Cary, NC (US); Steven E. Mikes, Apex, NC (US); Hayden C. Cranford, Jr., Cary, NC (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/467,617

(22) Filed: Mar. 23, 2017

(51) Int. Cl.
*H03F 1/34* (2006.01)
*H03F 1/02* (2006.01)
*H03F 1/30* (2006.01)
*H03F 3/21* (2006.01)

(52) U.S. Cl.
CPC .............. *H03F 1/0288* (2013.01); *H03F 1/30* (2013.01); *H03F 3/211* (2013.01); *H03F 2200/135* (2013.01); *H03F 2203/21131* (2013.01)

(58) Field of Classification Search
CPC ......................................................... H03F 1/34
USPC .................................................... 330/85, 305
See application file for complete search history.

(56) References Cited

U.S. PATENT DOCUMENTS

| | | | | |
|---|---|---|---|---|
| 5,510,751 A * | 4/1996 | Nauta | ...................... | H04B 3/02 330/260 |
| 8,558,611 B2 * | 10/2013 | Bulzacchelli | ........... | H03F 3/195 330/124 R |
| 8,779,858 B2 * | 7/2014 | Niederberger | ............ | H03F 1/26 330/109 |
| 8,952,758 B2 | 2/2015 | Embar et al. | | |
| 2013/0266156 A1 * | 10/2013 | Frohlich | ................... | H03F 1/34 381/120 |

\* cited by examiner

*Primary Examiner* — Henry Choe
(74) *Attorney, Agent, or Firm* — David Cain; Hoffman Warnick LLC

(57) ABSTRACT

A tunable peaking amplifier circuit including: an input node, an output node, and a feedback node; a first input amplifier having an input connected to the input node and an output connected to the feedback node; a second input amplifier having an input connected to the input node; a coupling capacitor connected between an output of the second input amplifier and the feedback node; an amplifier having an input connected to the feedback node and an output connected to the output node; a feedback circuit including: a base feedback amplifier having an input connected to the output node and an output connected to the feedback node; and a tunable feedback amplifier having an input connected to the output node and an output connected to the feedback node; and a tuning circuit for varying a transconductance of the feedback circuit to adjust an operational frequency of the peaking amplifier circuit.

19 Claims, 13 Drawing Sheets

PEAKING AMPLIFIER FREQUENCY TUNING

TECHNICAL FIELD

The subject matter disclosed herein relates generally to transmission systems, and more particularly to high speed peaking amplifier frequency tuning.

BACKGROUND

With the ever present demand for higher data rates in serial links, transmission frequencies have continued to increase. Unfortunately, the vast majority of communication channels suffer high losses at higher frequencies. To improve the maximum data rates of such links, it is often necessary to equalize the frequency response of the channel so that pulse distortion is reduced. For this reason, the receivers of modern high-speed data communication links commonly employ peaking amplifiers, which boost the high-frequency components of the received signal that were attenuated by the channel response.

Many peaking amplifiers use some combination of series inductive and/or shunt capacitive loading to generate a high gain at a certain frequency while suppressing the signal at other frequencies. While an effective solution, this type of peaking amplifier possesses an inherent tradeoff between bandwidth and loss/noise, with many peaking amplifiers focusing on a narrowband response with high signal integrity. While most of these peaking amplifiers are only meant to operate at a specific frequency, this narrowband response becomes problematic over PVT (process, voltage, temperature) variation, where the response of the peaking amplifier may shift such that the operating frequency is out of band.

SUMMARY

The subject matter disclosed herein relates generally to transmission systems, and more particularly to high speed peaking amplifier frequency tuning.

A first aspect includes a tunable peaking amplifier circuit including: an input node, an output node, and a feedback node; a first input amplifier having an input connected to the input node and an output connected to the feedback node; a second input amplifier having an input connected to the input node; a coupling capacitor connected between an output of the second input amplifier and the feedback node; an amplifier having an input connected to the feedback node and an output connected to the output node; a feedback circuit including: a base feedback amplifier having an input connected to the output node and an output connected to the feedback node; and a tunable feedback amplifier having an input connected to the output node and an output connected to the feedback node; and a tuning circuit for varying a transconductance of the feedback circuit to adjust an operational frequency of the peaking amplifier circuit.

A second aspect is related to a peaking amplifier circuit, including: an input node, an output node, and a feedback node; a first input amplifier having an input connected to the input node and an output connected to the feedback node; a second input amplifier having an input connected to the input node; a coupling capacitor connected between an output of the second input amplifier and the feedback node; an amplifier having an input connected to the feedback node and an output connected to the output node; a feedback circuit including: a base feedback amplifier having an input connected to the output node and an output connected to the feedback node; and a tunable feedback amplifier having an input connected to the output node and an output connected to the output of the second input amplifier; and a tuning circuit for varying a transconductance of the feedback circuit to adjust an operational frequency of the peaking amplifier circuit.

A third aspect is directed to a method, including: adjusting a transconductance of a feedback circuit of a peaking amplifier; adjusting an operational frequency of the peaking amplifier in response to the adjustment of the transconductance of the feedback circuit; and reducing a variation in DC gain attenuation at different operational frequencies of the peaking amplifier.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure.

Figure 1:
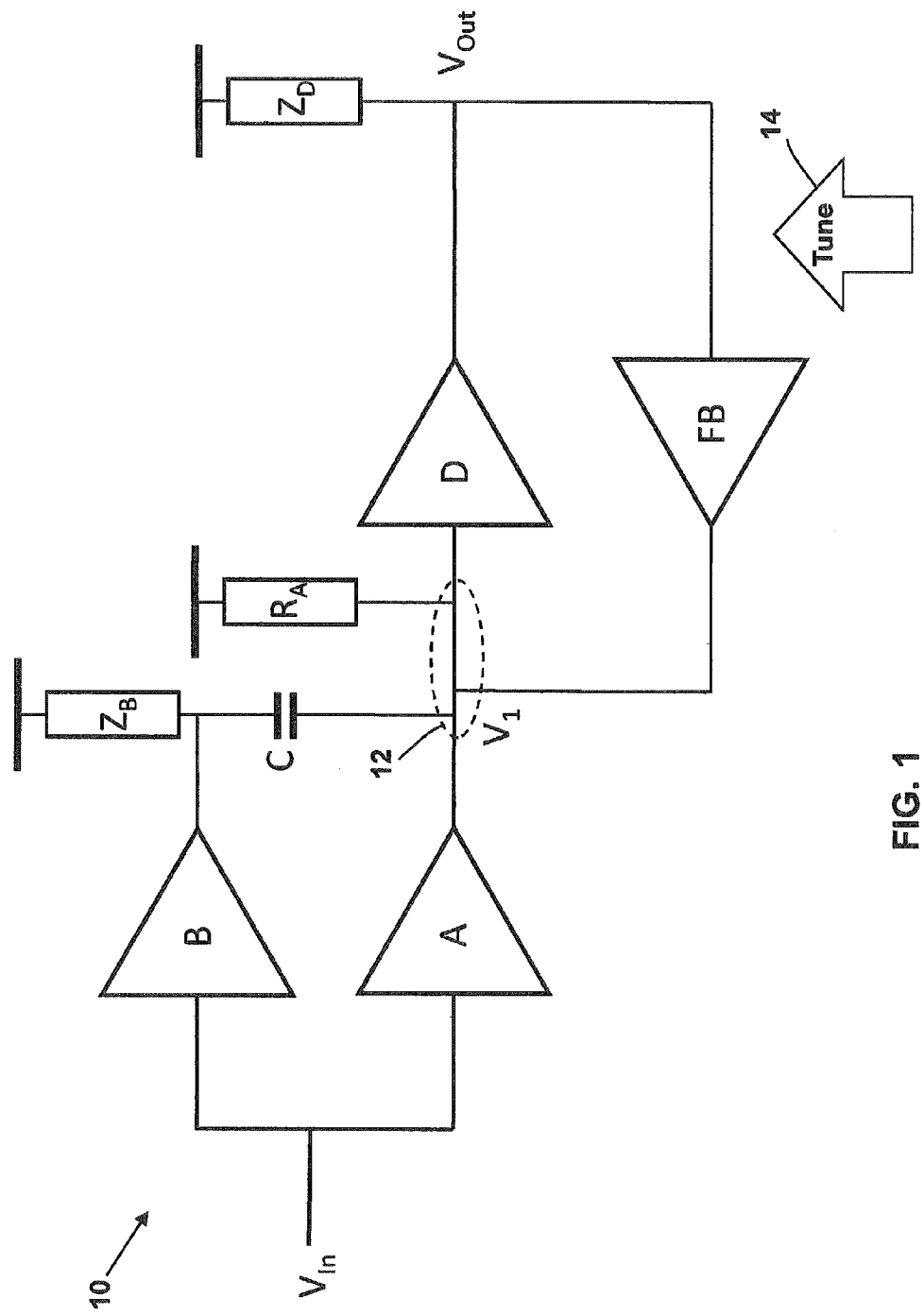
FIG. 1 depicts a frequency tunable peaking amplifier according to embodiments.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative. It is understood that the various process steps discussed herein can be implemented in the same manner and/or with slight modifications.

Referring to FIG. 1, there is shown a frequency tunable peaking amplifier 10 according to embodiments. The peaking amplifier 10 may, for example, be a Serializer/Deserializer (SERDES) type peaking amplifier. In general, the peaking amplifier 10 includes an input amplifier A, an input amplifier B, an amplifier D, and a feedback amplifier FB. The input amplifiers A and B have inputs that are commonly connected to an input voltage Vin. The output of the input amplifier A is connected to a feedback node 12. The output of the input amplifier B is capacitively coupled to the output of the amplifier A by a coupling capacitor C. The output of the input amplifier A is connected to a load resistor $R_A$. The load resistor $R_A$ is connected between the feedback node 12 and a supply voltage.

The input of the amplifier D is connected to the feedback node 12, and the output of amplifier D is connected to an output node $V_{Out}$ of the peaking amplifier 10. The input of the feedback amplifier FB is connected to the output node $V_{Out}$ of the peaking amplifier 10, and the output of the feedback amplifier FB is connected to the feedback node 12. The feedback amplifier FB shares the load resistor $R_A$ with input amplifier A.

The basic function of the peaking amplifier 10 is outlined as follows: The input amplifier A provides a relatively low transconductance $g_{mA}$ from Vin to $V_1$ (at the feedback node 12) at all frequencies, while the amplifier D provides a much higher transconductance (e.g., >10 $g_{mA}$) from $V_1$ to $V_{Out}$. The feedback amplifier FB attempts to bring down the magnitude of $V_{Out}$ through a negative feedback loop. The feedback transconductance $g_{mFB}$ of the feedback amplifier FB is approximately equal to $-g_{mA}$.

The amplifier B provides a large transconductance $g_{mB}$ (e.g., also >10 $g_{mA}$), which is AC coupled into the feedback node 12 through the coupling capacitor C. At low frequencies, $g_{mB}$ is isolated from the output. However, as the input frequency increases, the impedance of the coupling capacitor C drops, allowing $g_{mB}$ to overpower the negative feedback of the feedback amplifier FB, increasing the overall gain of the peaking amplifier 10. The peaking frequency of the peaking amplifier 10 may be controlled, for example, by adjusting the inductive components of load impedances $Z_B$ and $Z_D$.

The overall transfer function of the peaking amplifier 10 is given by the following equation:

$$\frac{V_{out}}{V_{in}} = \frac{G_A G_2}{1 + G_{FB} G_2} \cdot \frac{1 + sCZ_B\left(1 + \frac{g_{mB}}{g_{mA}}\right)}{1 + sCZ_B\left(1 + \frac{R_A/Z_B}{1 + G_{FB}G_2}\right)}$$

Figure 2:
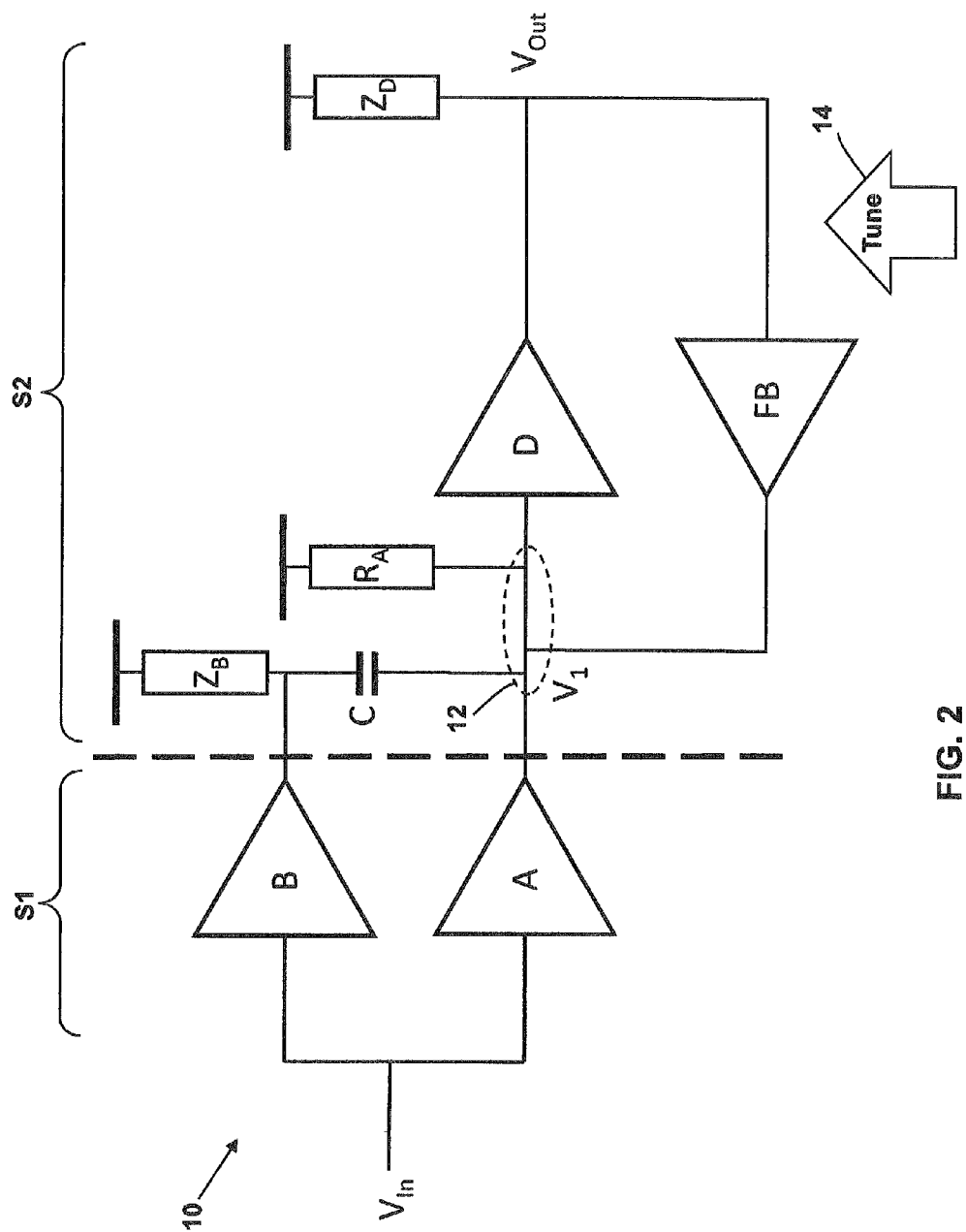
FIG. 2 depicts the frequency tunable peaking amplifier of FIG. 1 divided into two stages according to embodiments.

Where:
$G_A = g_{mA} \cdot R_A$
$G_B = g_{mB} \cdot Z_B$
$G_D = g_{mD} \cdot Z_D$
$G_{FB} = g_{mFB} \cdot R_A$ To better understand the peaking amplifier frequency tuning disclosed herein, let us consider the peaking amplifier 10 as a cascaded system as shown in FIG. 2 with a first stage S1 including the amplifiers A and B, and a second, feedback stage S2 containing the feedback loop. To this extent, the transfer function of the feedback stage S2 may be described by the following equation:

$$\frac{V_{out}}{V_1} = \frac{\alpha}{1 + \alpha\beta}$$

where
$\alpha = G_D$
and $$\beta = g_{mFB} \cdot \frac{R_A(1 + sCZ_B)}{1 + sC(R_A + Z_B)}$$

Then, it follows that:

$$\frac{V_{out}}{V_1} = \frac{\alpha(1 + sC(Z_B + R_A))}{1 + \alpha g_{mFB} R_A + sC(Z_B + R_A + sC(Z_B + R_A + g_{mFB}R_A Z_B)}$$

From this transfer function, the frequency of the dominant pole can be determined to be:

$$\omega_p = \frac{1}{CZ_B\left(1 + \frac{R_A/Z_B}{1 + G_{FB}G_D}\right)}$$

It has been observed, in accordance with the above equation, that the operating frequency can be increased, and thus the frequency rolloff pushed higher, by increasing the $G_{FB}$ term, which is the product of $g_{mFB}$ and $R_A$. Similarly, the operating frequency can be decreased, and thus the frequency rolloff pushed lower, by decreasing the $G_{FB}$ term. While $R_A$ may in some cases be difficult to adjust electrically, $g_{mFB}$ can be electrically adjusted, as presented in detail below and generally indicated by arrow 14 in FIGS. 1 and 2, by suitably tuning the feedback stage S2 of the peaking amplifier 10. In addition, $g_{mFB}$ can be changed with minimal impact on the forward gain path in the peaking amplifier 10, while both amplifiers A and B push their transconductance through $R_A$. To this extent, according to embodiments, the operating frequency of the peaking amplifier 10 can be moved or "tuned" without adversely affecting the gain of the peaking amplifier 10 at that frequency.

Figure 3:
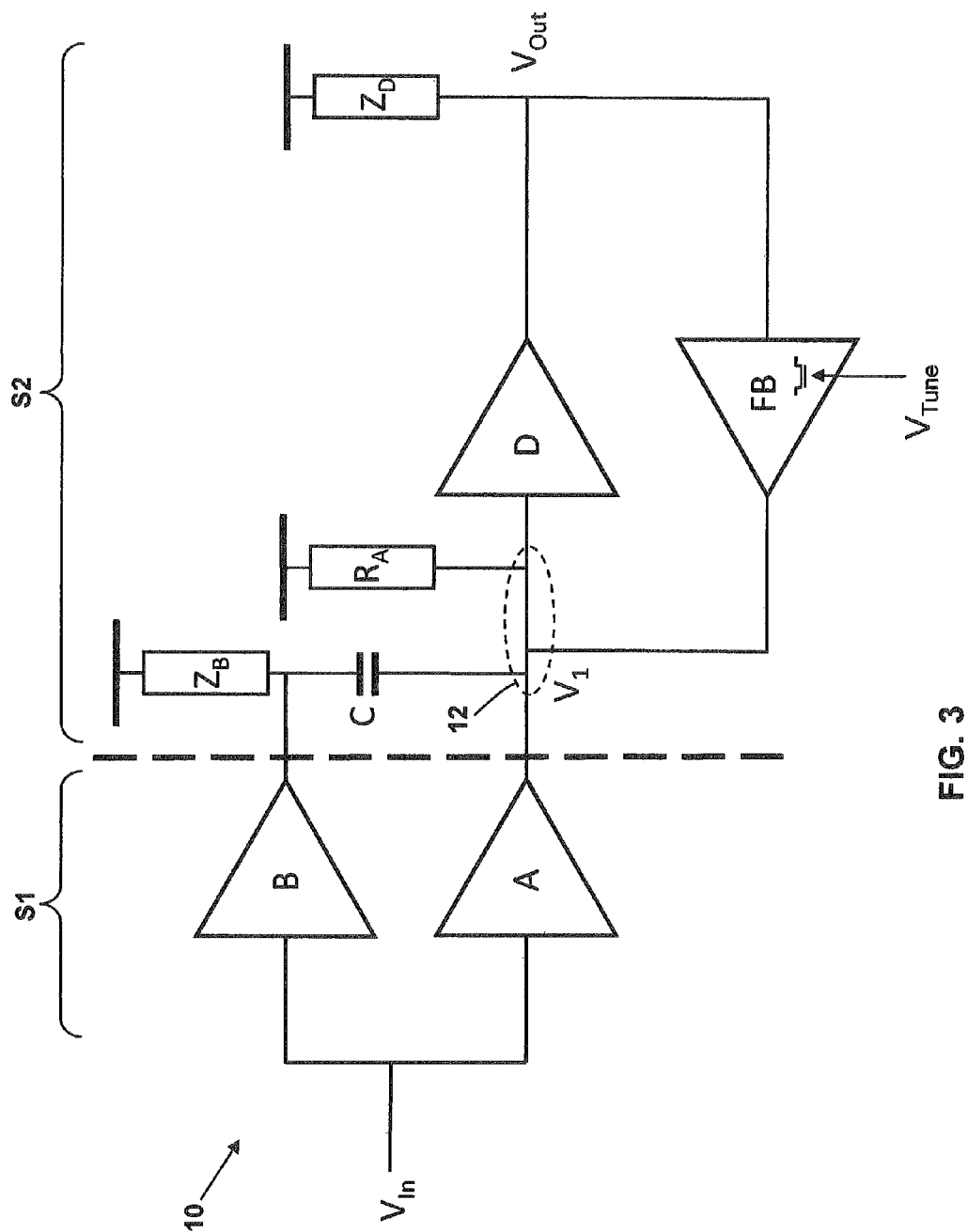
FIG. 3 depicts a frequency tunable peaking amplifier with fine tuning according to embodiments.

One technique, for tuning the feedback stage S2 of the peaking amplifier 10, depicted in FIG. 3, involves adjusting the bias voltage ($V_{Tune}$) of the tail current in the feedback amplifier FB, which will accordingly vary the transconductance $g_{mFB}$ of the feedback amplifier FB. According to embodiments, there is a monotonic relationship between $V_{Tune}$ and $g_{mFB}$, such that $g_{mFB}$ increases as $V_{Tune}$ is increased, and $g_{mFB}$ decreases as $V_{Tune}$ is decreased. By varying the transconductance $g_{mFB}$ of the feedback amplifier FB using tail current tuning (via $V_{Tune}$), the pole of the feedback path can be adjusted as described above according to:

$$\omega_p = \frac{1}{CZ_B\left(1 + \frac{R_A/Z_B}{1 + G_{FB}G_D}\right)}$$

Thus,

Higher $g_{mFB}$→Higher $\omega_p$→Higher $\omega_{peak}$ and

Lower $g_{mFB}$→Lower $\omega_p$→Lower $\omega_{peak}$.

In a particular embodiment, the tail transistor in the feedback amplifier FB has a threshold voltage $V_t$=~290 mV. In this case, the peak frequency of the peaking amplifier 10 can continue to be adjusted with $V_{Tune}$ below this value, gradually cutting out the feedback path. Above a $V_{Tune}$ of ~400 mV, the drain voltage cannot keep the input transistor in saturation, and performance suffers accordingly. Thus, in this example, a suitable tuning range for $V_{Tune}$ is set to approximately 190 mV-390 mV. For practical purposes, this tuning may be accomplished, for example, using a tunable current mirror. If mirrored through an identical device, the input current will vary from approximately 10 µA-50 µA.

Figure 4:
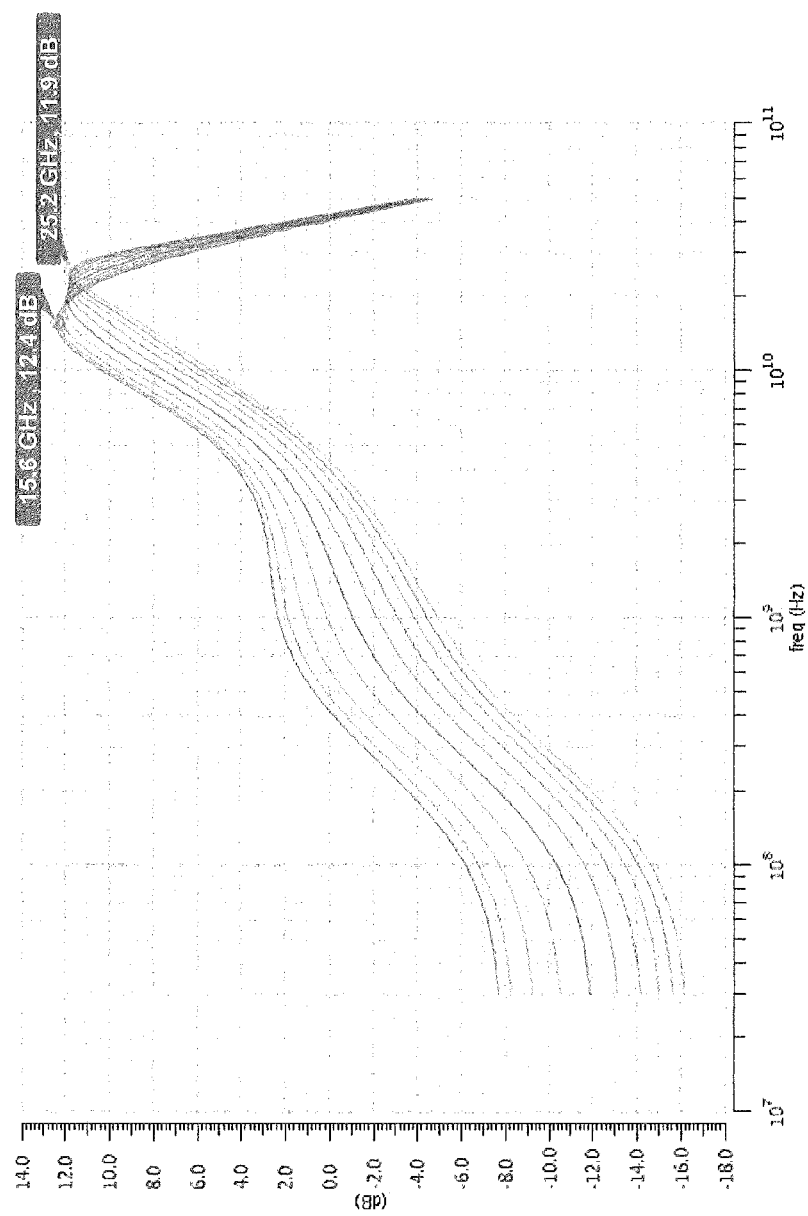
FIG. 4 depicts a chart of the frequency response of an illustrative peaking amplifier with fine tuning according to embodiments.

A chart of the frequency response of an illustrative peaking amplifier 10 with fine tuning according to embodiments is presented in FIG. 4. As shown, the tuning bandwidth of the peaking amplifier 10, when tuned using $V_{Tune}$ (FIG. 3), is approximately 15.6 GHz-25.2 GHz. Within this bandwidth, there is a minimal variation in the high frequency gain from approximately 12.4 dB-11.9 dB.

The use of $V_{Tune}$ allows for a "fine" adjustment of the transconductance $g_{mFB}$ of the feedback amplifier FB. This fine tuning may be performed, for example, by adjusting the bias current (e.g., through $V_{Tune}$) of the feedback amplifier FB which, as described above, results in a monotonic change in the transconductance $g_{mFB}$. By varying the transconductance $g_{mFB}$ of the feedback amplifier FB in this manner, the pole of the feedback path can be adjusted as described above.

Figure 5:
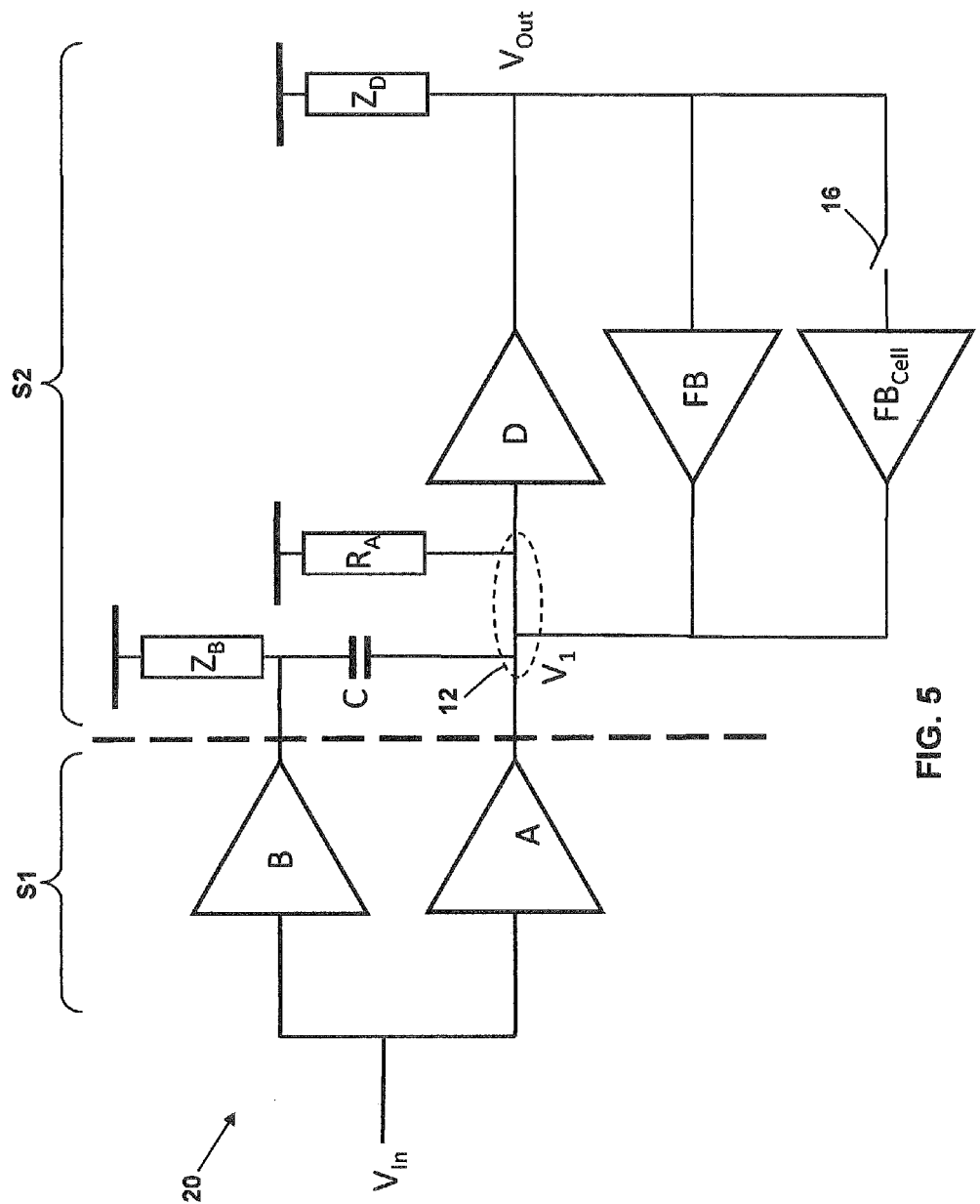
FIG. 5 depicts a frequency tunable peaking amplifier with coarse tuning according to embodiments.

According to other embodiments, as depicted in FIG. 5, a "coarse" tuning of the total transconductance $g_{mS2}$ of the feedback amplifiers (e.g., feedback amplifier FB and feedback amplifier cells $FB_{Cell}$) in the feedback stage S2 can be provided by switching one or more feedback amplifier cells $FB_{cell}$ into or out of the feedback stage S2 of a frequency tunable peaking amplifier 20. This results in a linear increase or decrease, respectively, of the total transconductance $g_{mS2}$ of the feedback amplifiers in the feedback stage S2, and a corresponding increase or decrease, respectively, of the pole of the feedback stage S2. Each feedback amplifier cell $FB_{Cell}$ may provide the same amount of transconductance $g_{mFB}$, or may provide different levels of transconductance $g_{mFB}$.

Figure 6:
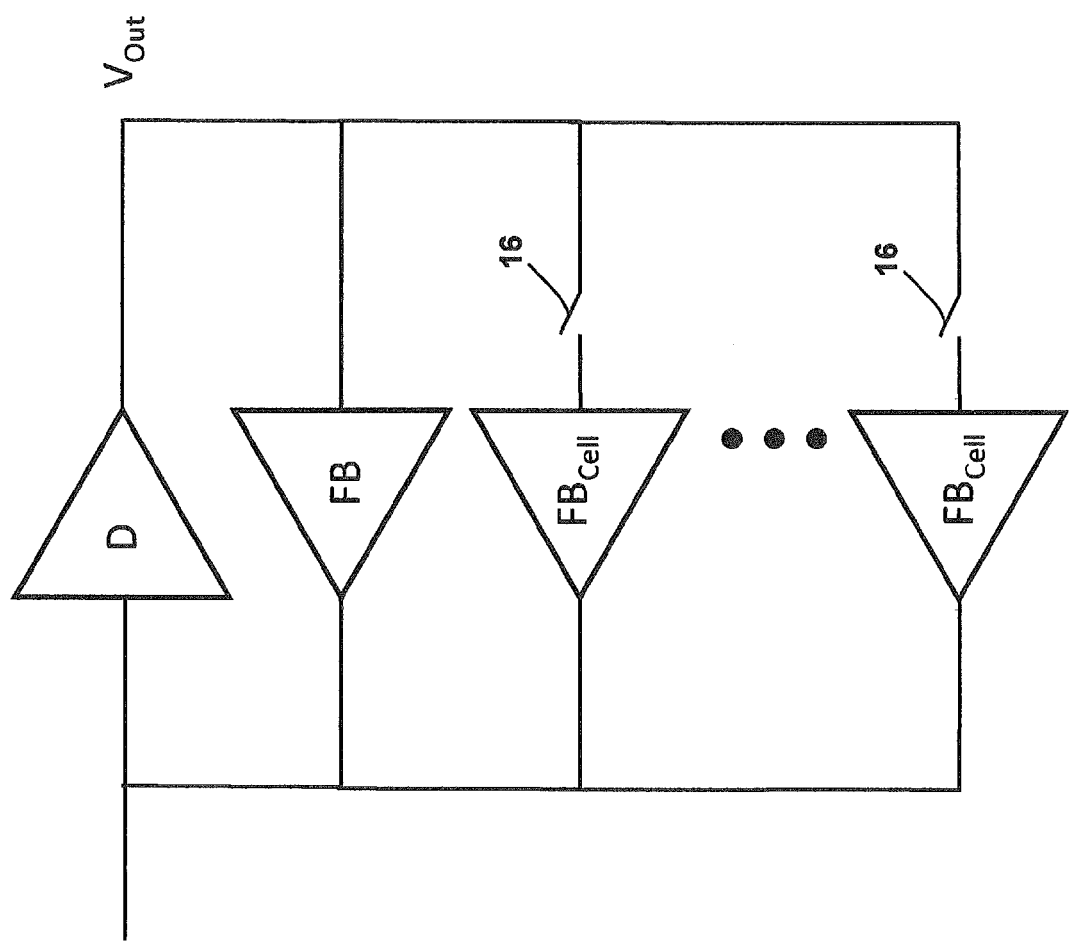
FIG. 6 depicts the selective activation/deactivation of one or more feedback amplifiers using input switches.

The switching of a feedback amplifier cell $FB_{Cell}$ into or out of the feedback stage S2 of the peaking amplifier 20 may be actuated using a switch 16 at the input of the feedback amplifier cell $FB_{Cell}$ as shown in FIG. 5. Tuning can be provided as shown in FIG. 6 by selectively activating/deactivating one or more of the feedback amplifier cells $FB_{Cell}$ using respective input switches 16. While tuning in this manner may be sufficient for some applications, it requires switches 16 capable of handling a high frequency signal, and may result in a large capacitive variation at the output.

Figure 7:
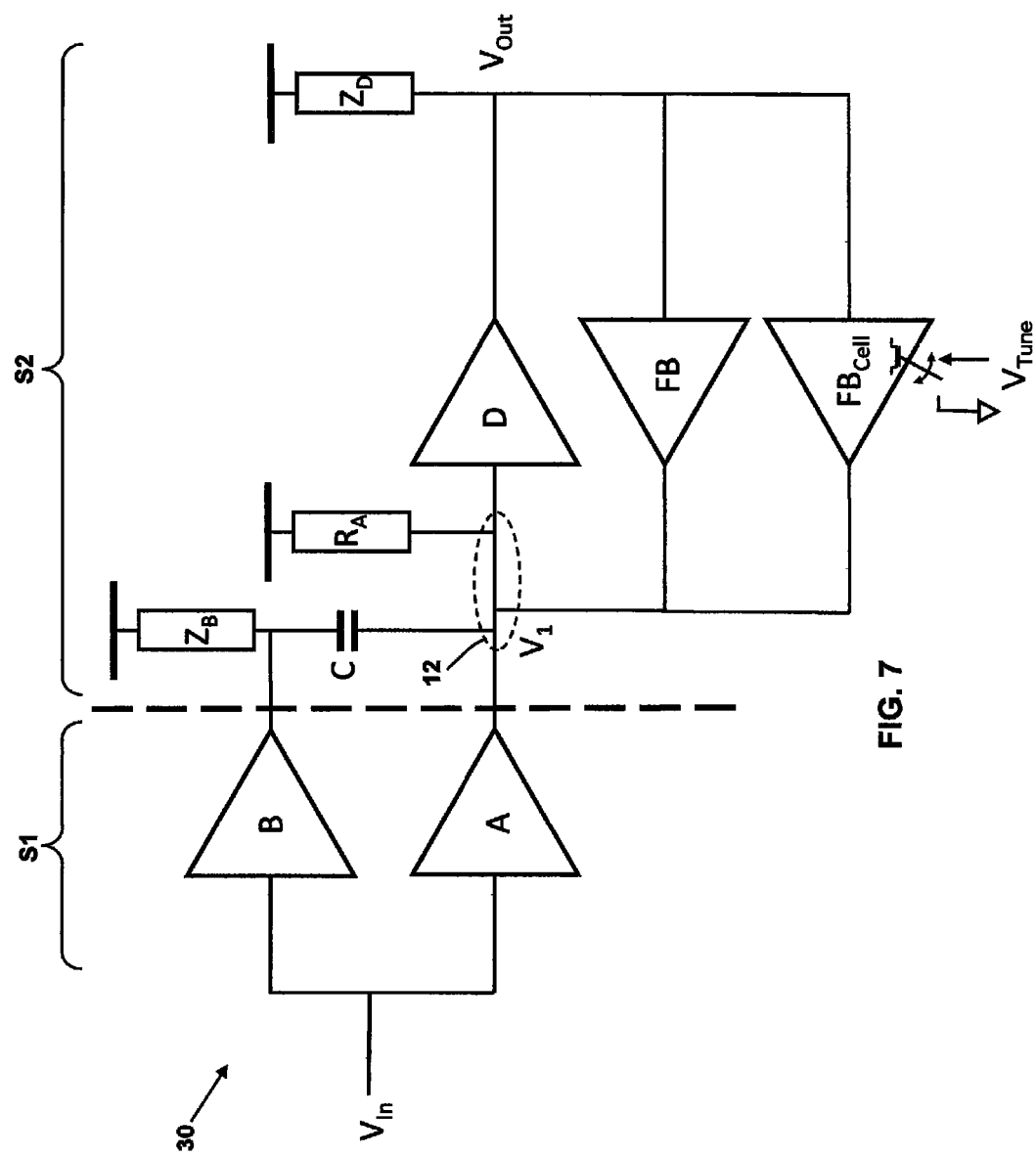
FIG. 7 depicts a frequency tunable peaking amplifier with coarse tuning according to embodiments.

To avoid issues related to the use of a switch 16 at the input of a feedback amplifier cell $FB_{Cell}$, switching may be accomplished at the gate of the tail transistor in the feedback amplifier cell $FB_{cell}$. This is the same node in the feedback amplifier FB at which $V_{Tune}$ is applied for fine tuning. For example, as shown in FIG. 7, a feedback amplifier cell $FB_{Cell}$ of a frequency tunable peaking amplifier 30 may be switched off by applying a $V_{Tune}=V_{SS}$ (e.g., ground) to the gate of the tail transistor in the feedback amplifier cell $FB_{Cell}$. To this extent, the feedback path provided by a feedback amplifier cell $FB_{Cell}$ can be eliminated simply by applying a voltage $V_{Tune}$ that causes the tail transistor in the feedback amplifier cell $FB_{Cell}$ to turn off.

Figure 8:
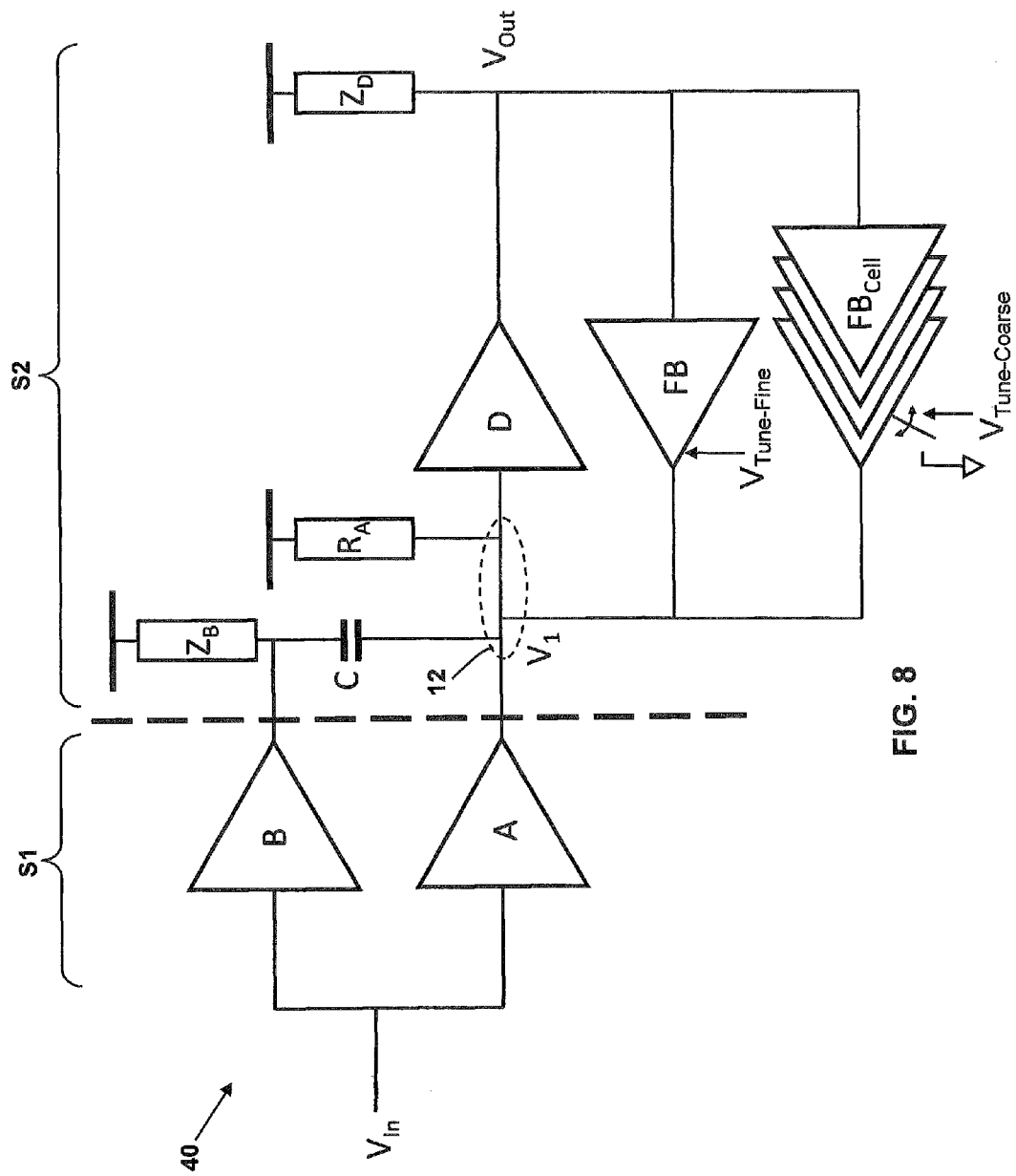
FIG. 8 depicts a frequency tunable peaking amplifier with fine and coarse tuning according to embodiments.

The concepts of fine and coarse tuning in a frequency tunable peaking amplifier 40 can be combined into a single implementation as shown in FIG. 8. In this embodiment, a "fine" adjustment of the transconductance $g_{mFB}$ of the feedback amplifier FB, and thus of the total transconductance $g_{mS2}$ of the feedback amplifiers in the feedback stage S2, may be provided by adjusting the bias current $V_{Tune-Fine}$ applied to the gate of the tail transistor in the feedback amplifier FB. By varying the transconductance $g_{mFB}$ of the feedback amplifier FB in this manner, a fine adjustment of the pole of the feedback path can be obtained as described above.

Still referring to FIG. 8, a "coarse" tuning of the total transconductance $g_{mS2}$ of the feedback stage S2 can be provided by switching one or more feedback amplifier cells $FB_{Cell}$ into or out of the feedback stage S2 of the peaking amplifier 40. For example, a given feedback amplifier cell $FB_{cell}$ may be switched off by applying a $V_{Tune-Coarse}=V_{SS}$ (e.g., ground) to the gate of the tail transistor in the feedback amplifier cell $FB_{cell}$. This results in a linear change of the total transconductance $g_{mS2}$ of the feedback stage S2, and a corresponding change of the pole of the feedback stage S2.

Figure 9:
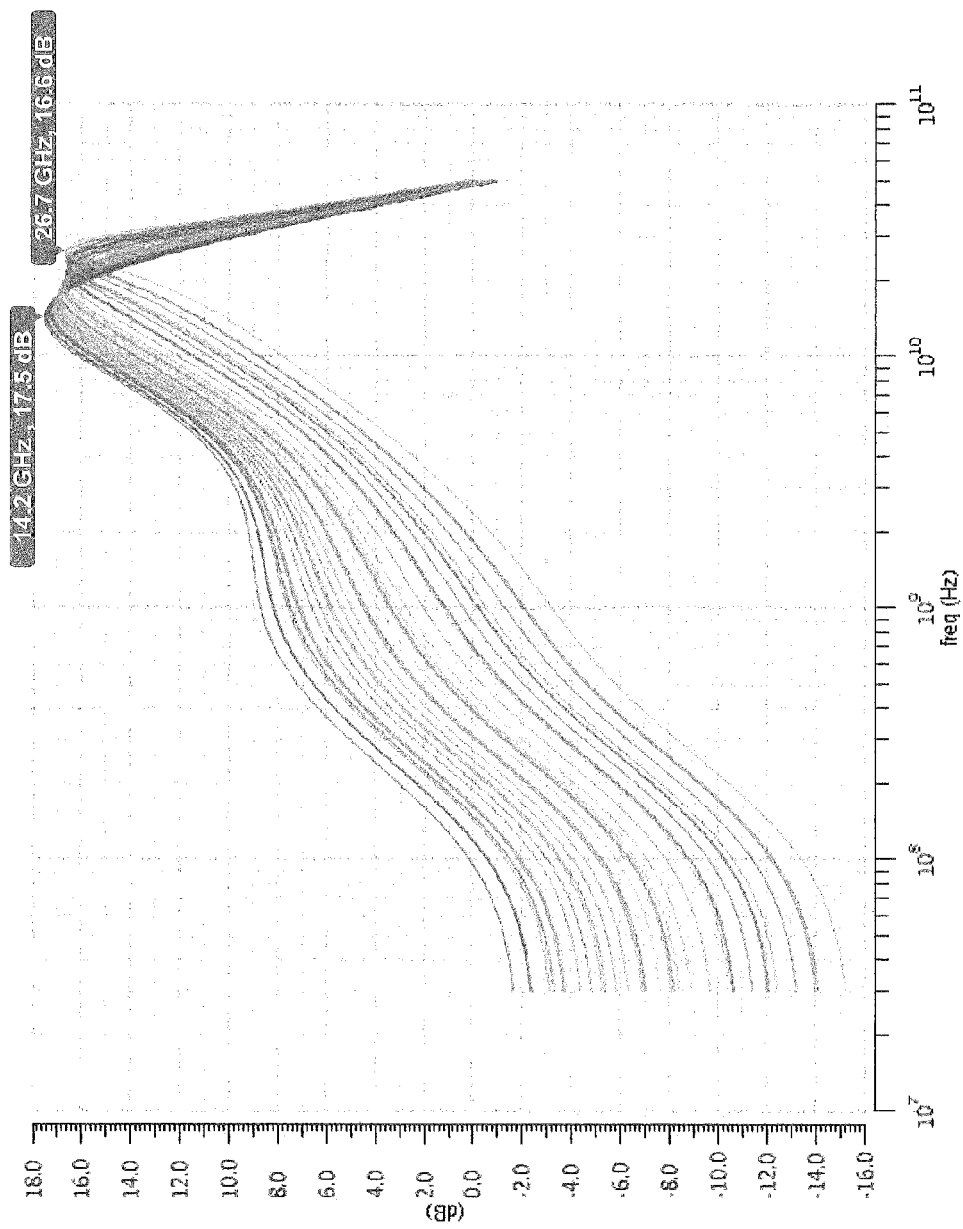
FIG. 9 depicts a chart of the frequency response of an illustrative peaking amplifier with fine and coarse tuning according to embodiments.

A chart of the frequency response of an illustrative peaking amplifier 40 with fine and coarse tuning according to embodiments is presented in FIG. 9. As shown, the tuning bandwidth of the peaking amplifier 40 with fine and coarse tuning is approximately 14.2 GHz-26.7 GHz. Within this bandwidth, there is a minimal variation in the high frequency gain from approximately 17.5 dB-16.6 dB. Comparing FIGS. 4 and 9, it can be seen that in both cases the tuning mechanism(s) disclosed herein provide a peaking amplifier with a multi-GHz tuning range (instead of a single frequency). In addition, the use of fine and coarse tuning may increase the tuning range of a peaking amplifier compared to just fine tuning.

A control circuit may be used in any of the embodiments of the frequency tunable peaking amplifiers 10, 20, 30, 40, 50 (described below), 60 (described below) disclosed herein to control the transconductance of the feedback stage S2 and adjust the operational frequency of the peaking amplifier. Other components of the control circuit may be included to provide control schemes for adjusting the value of the transconductance of the feedback stage S2. For example, a dynamic control scheme may be implemented, wherein the transconductance of the feedback stage S2 is dynamically adjusted under changing operating conditions. In particular, a control circuit can be employed to receive as input certain data regarding operating conditions, e.g., data rates, channel loss, etc., and then dynamically output a control signal (e.g., tuning voltage) to dynamically adjust the value of the transconductance of the feedback stage S2 to adjust the operational frequency of the peaking amplifier.

It can be seen from FIGS. 4 and 9 that the widening of the tuning bandwidth provided by the above-described embodiments of the peaking amplifier may be accompanied by a corresponding variation in DC gain attenuation. This relationship can be better understood by referring again to Equation 1, reproduced below:

$$\frac{V_{out}}{V_{in}} = \frac{G_A G_2}{1 + G_{FB} G_2} \cdot \frac{1 + sCZ_B\left(1 + \frac{g_{mB}}{g_{mA}}\right)}{1 + sCZ_B\left(1 + \frac{R_A/Z_B}{1 + G_{FB} G_2}\right)} \quad \text{(Equation 1)}$$

As evident from Equation 1, an increase in $g_{mFB}$ results in a corresponding increase in $G_{FB}$ (recall that $G_{FB}=g_{mFB}\cdot R_A$), which results in a decrease in the overall gain of the peaking amplifier. While this is, of course, beneficial to the high frequency response, the variation in the DC gain attenuation may not be suitable for some applications. To this extent, additional embodiments of a peaking amplifier which counteract such a variation in DC gain attenuation are presented below.

Figure 10:
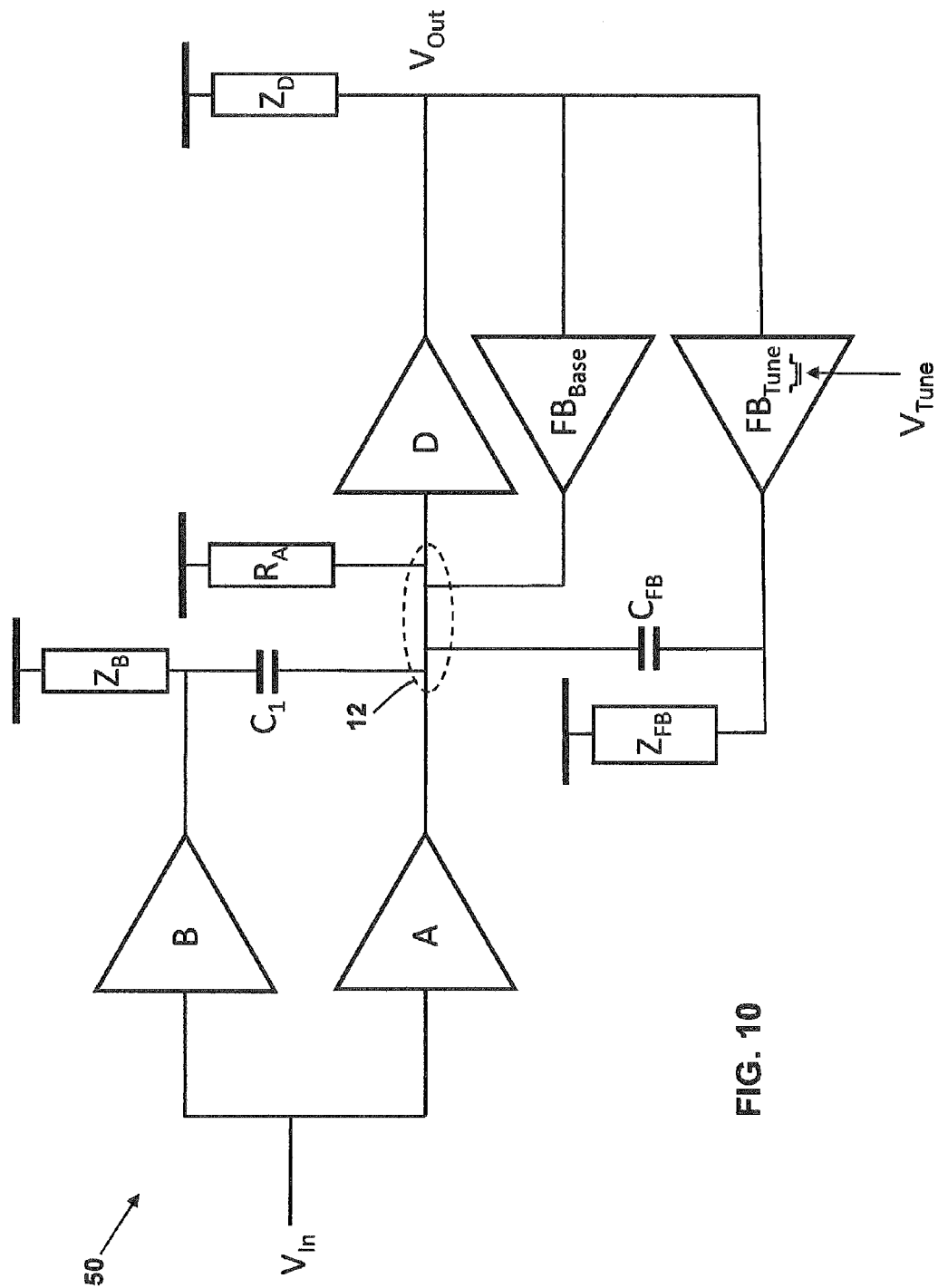
FIG. 10 depicts a frequency tunable peaking amplifier with reduced DC gain attenuation variation according to embodiments.

A frequency peaking amplifier 50 for counteracting variations in DC gain attenuation according to embodiments is depicted in FIG. 10. Similar to the peaking amplifier 10 described above with regard to FIG. 3, the peaking amplifier 50 includes an input amplifier A, an input amplifier B, and an amplifier D. The input amplifiers A and B have inputs that are commonly connected to an input voltage $V_{In}$. The output of the input amplifier A is connected to a feedback node 12. The output of the input amplifier B is capacitively coupled to the output of the amplifier A by a coupling capacitor $C_1$. The output of the input amplifier A is connected to a load resistor $R_A$. The load resistor $R_A$ is connected between the feedback node 12 and a supply voltage.

The input of the amplifier D is connected to the feedback node 12, while the output of amplifier D is connected to an output node $V_{Out}$ of the peaking amplifier 50. Load impedances $Z_B$ and $Z_D$ are present at the outputs of the input amplifier B and the amplifier D, respectively.

Unlike the peaking amplifier 10, the peaking amplifier 50 includes an untuned, base feedback amplifier $FB_{Base}$, which is always on, and a tunable feedback amplifier $FB_{Tune}$. The tunable feedback amplifier $FB_{Tune}$ may be tuned using any of the techniques detailed above (e.g., through adjustment of $V_{Tune}$ and/or variation in the number of feedback amplifier cells). The inputs of the base feedback amplifier $FB_{Base}$ and the tunable feedback amplifier $FB_{Tune}$ are connected to the output node $V_{Out}$ of the peaking amplifier 50. The output of the base feedback amplifier $FB_{Base}$ is connected to the feedback node 12. The output of the tunable feedback amplifier $FB_{Tune}$ is capacitively coupled to the feedback node 12 by a feedback coupling capacitor $C_{FB}$ and is further connected to a load impedance $Z_{FB}$.

Figure 11:
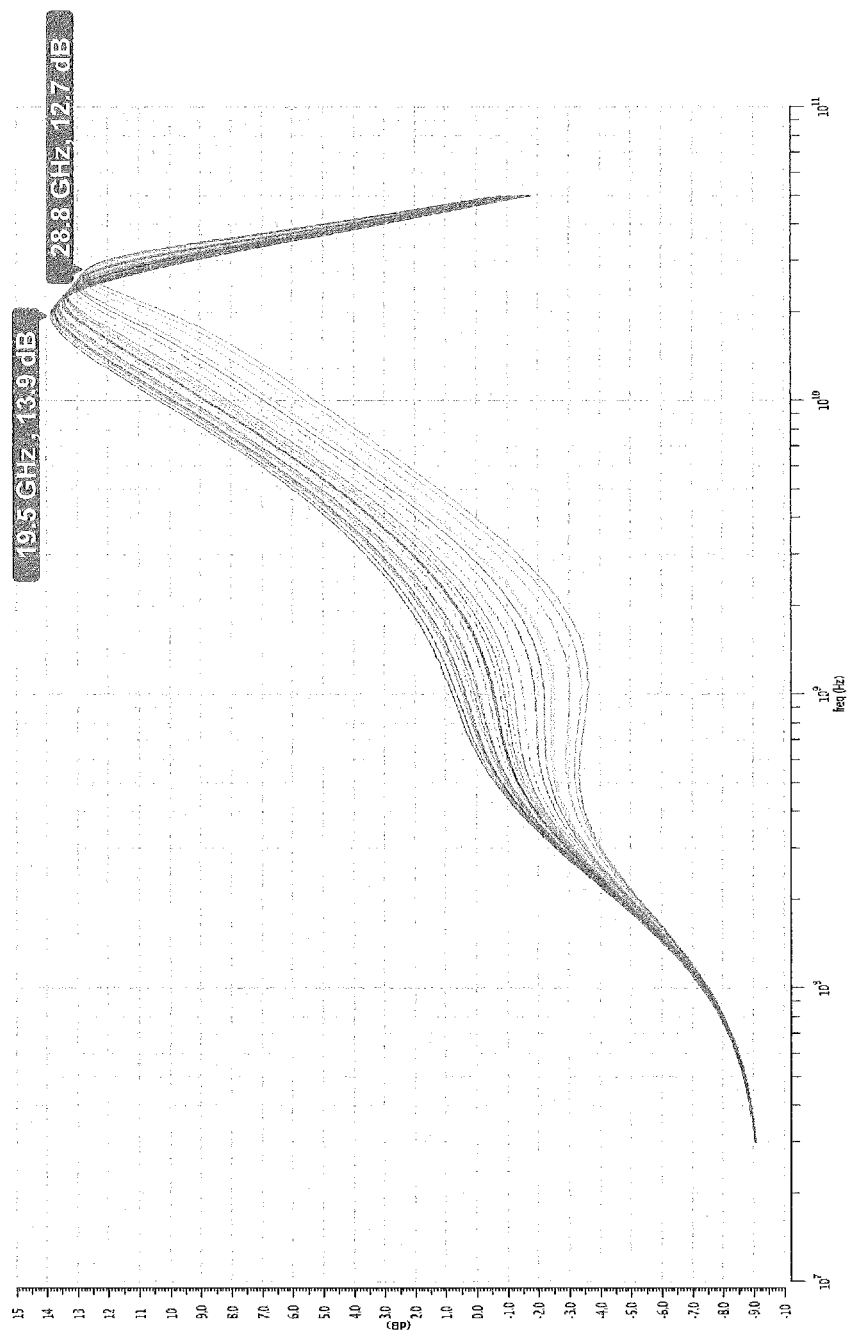
FIG. 11 depicts a chart of the frequency response of the peaking amplifier of FIG. 10 according to embodiments.

The inclusion of the untuned, base feedback amplifier $FB_{Base}$, tunable feedback amplifier $FB_{Tune}$, coupling capacitor $C_{FB}$, and load impedance $Z_{FB}$ in the peaking amplifier 50 results in a reduction of the variation in DC gain attenuation. A chart of the frequency response of an illustrative peaking amplifier 50 is presented in FIG. 11. Comparing FIGS. 4 and 11, it can be seen that there is much less variation in DC gain attenuation for the peaking amplifier 50 compared to the peaking amplifier 10.

In the peaking amplifier 50, the coupling capacitor $C_{FB}$ capacitively couples the tunable feedback amplifier $FB_{Tune}$ to the feedback node 12. In addition, the load impedance $Z_{FB}$ keeps the tunable feedback amplifier $FB_{Tune}$ properly biased at DC. This configuration counteracts the DC gain variation and isolates DC shift from the feedback node 12. The peaking amplifier 50 provides a practically constant feedback factor at DC, due to the incorporation of the base feedback amplifier $FB_{Base}$, reducing variation in the DC gain attenuation over the $V_{Tune}$ sweep. The DC operation of the forward amplification path in the peaking amplifier 50 is completely isolated, allowing for an expanded tuning range. A moderate level of DC gain attenuation is maintained in the peaking amplifier 50 by the base feedback amplifier $FB_{Base}$ which is connected to the output of the input amplifier A (i.e., feedback node 12) in a negative feedback configuration.

Although the peaking amplifier 50 provides several advantages (e.g., deceased DC gain variation), such advantages do not come without the cost of additional components (e.g., coupling capacitor $C_{FB}$ and load impedance $Z_{FB}$), as well as a gain rolloff at higher frequencies. To this extent, as depicted in FIG. 12, a frequency peaking amplifier 60 is disclosed that provides advantages similar to those provided by the peaking amplifier 50, but without the need for a separate coupling capacitor $C_{FB}$ and load impedance $Z_{FB}$, and with reduced gain rolloff at higher frequencies.

Figure 12:
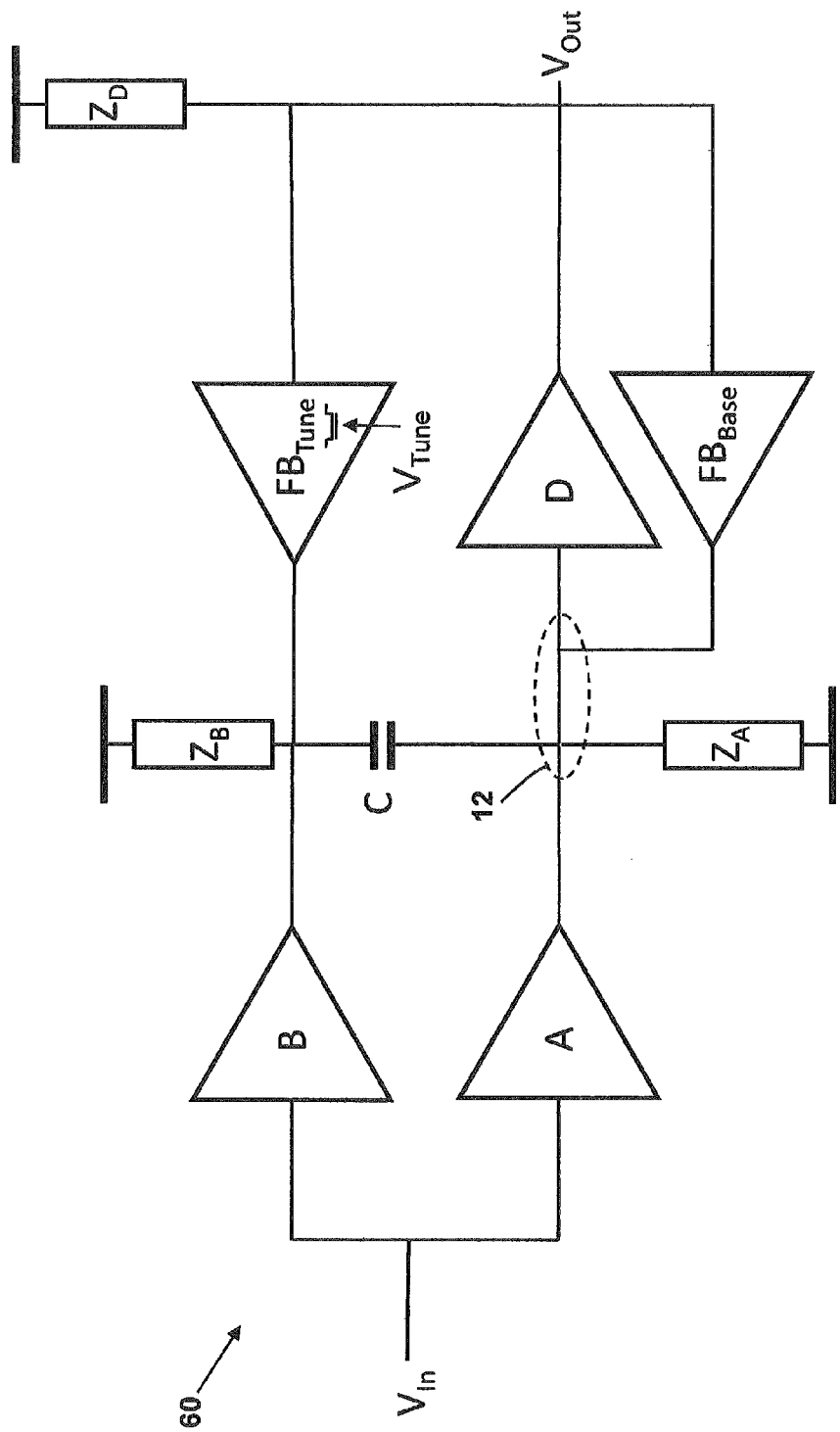
FIG. 12 depicts a frequency tunable peaking amplifier with reduced DC gain attenuation variation according to embodiments.

A frequency peaking amplifier 60 for counteracting variations in DC gain attenuation according to embodiments is depicted in FIG. 12. Similar to the peaking amplifier 50 described above with regard to FIG. 10, the peaking amplifier 60 shown in FIG. 12 includes an input amplifier A, an input amplifier B, and an amplifier D. The input amplifiers A and B have inputs that are commonly connected to an input voltage Vie. The output of the input amplifier A is connected to a feedback node 12. The output of the input amplifier B is capacitively coupled to the output of the amplifier A by a coupling capacitor C. The output of the input amplifier A is connected to a load impedance $Z_A$. The load impedance $Z_A$ is connected between the feedback node 12 and a supply voltage.

The input of the amplifier D is connected to the feedback node 12, and the output of amplifier D is connected to an output node Vow of the peaking amplifier 60. Load impedances $Z_B$ and $Z_D$ are present at the outputs of the input amplifier B and the amplifier D, respectively.

The peaking amplifier 60 further includes an untuned, base feedback amplifier $FB_{Base}$, which is always on, and a tunable feedback amplifier $FB_{Tune}$. The tunable feedback amplifier $FB_{Tune}$ may be tuned using any of the techniques detailed above (e.g., through adjustment of $V_{Tune}$ and/or variation in the number of feedback amplifier cells). The inputs of the base feedback amplifier $FB_{Base}$ and the tunable feedback amplifier $FB_{Tune}$ are connected to the output node Vow of the peaking amplifier 60. The output of the base feedback amplifier $FB_{Base}$ is connected to the feedback node 12. The output of the tunable feedback amplifier $FB_{Tune}$ is coupled to the output of the input amplifier B and is capacitively coupled to the output of the amplifier A by the coupling capacitor C.

Figure 13:
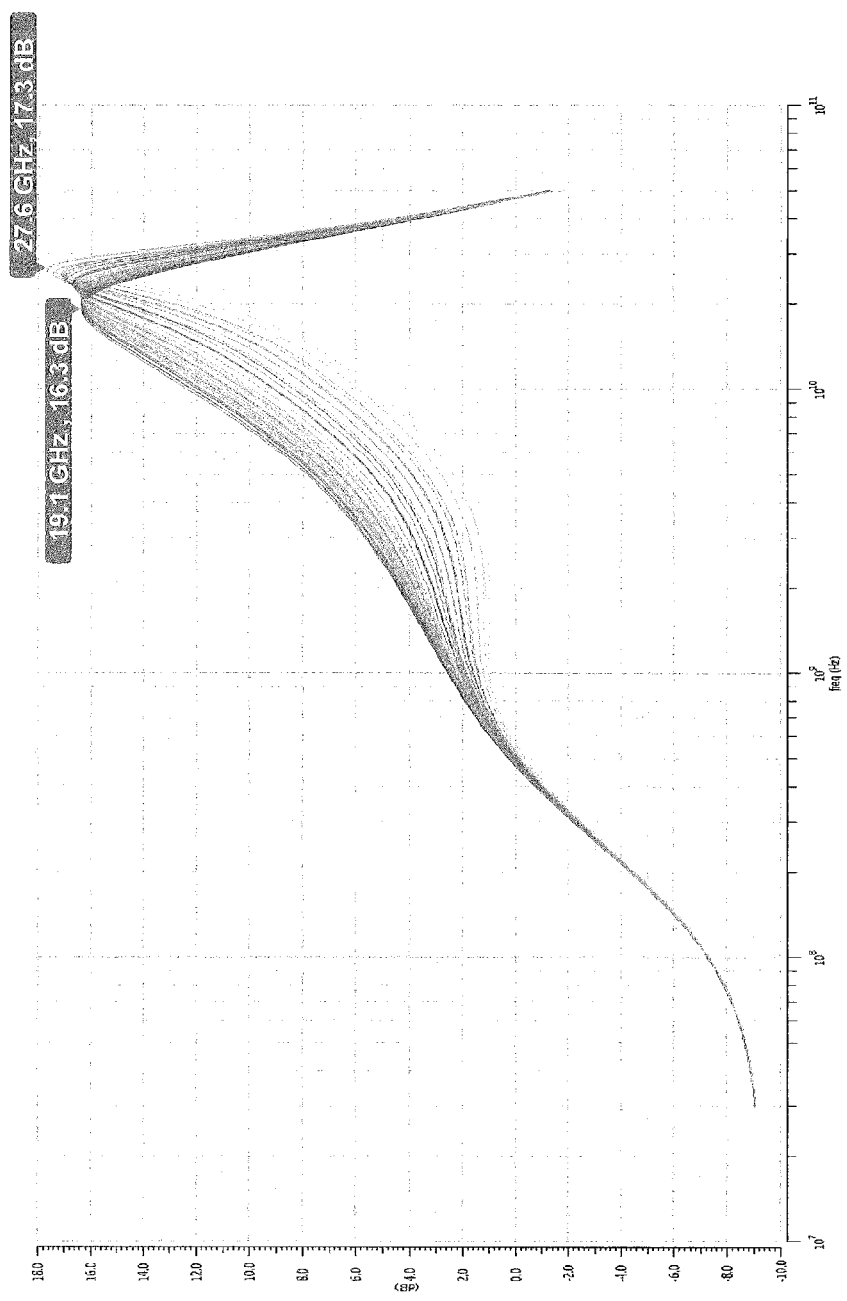
FIG. 13 depicts a chart of the frequency response of the peaking amplifier of FIG. 12 according to embodiments.

A chart of the frequency response of an illustrative peaking amplifier 60 is presented in FIG. 13. Comparing FIGS. 11 and 13, it can be seen that similar to the peaking amplifier 50, there is a reduced variation in DC gain attenuation associated with the peaking amplifier 60. However, rather than having gain rolloff at higher frequencies as occurs with the peaking amplifier 50, the there is less gain rolloff at higher frequencies for the peaking amplifier 60. In fact, the gain increases as the frequency increases.

Similar to the peaking amplifier 50, the peaking amplifier 60 provides a constant feedback factor at DC, due to the incorporation of the base feedback amplifier $FB_{Base}$, reducing variation in the DC gain attenuation over the $V_{Tune}$ sweep. Unlike the peaking amplifier 50, however, fewer additional capacitors or loads are needed in the peaking amplifier 60. There is less peak loss at high frequencies; gain increases as the frequency increases. The peaking amplifier 60 has a slightly reduced tuning range compared to the peaking amplifier 50.

Numerous embodiments of peaking amplifiers 10, 20, 30, 40, 50, 60 are disclosed herein, each having particular operational characteristics. Advantageously, one shared characteristic is a multi-GHz tuning range rather than a single frequency as provided by known peaking amplifiers. Additional advantages of each embodiment are described in detail above.

Further aspects of the present disclosure provide tunable peaking amplifiers which can be utilized in integrated circuit chips with various analog and digital integrated circuitries. For example, integrated circuit dies can be fabricated having peaking amplifiers and other semiconductor devices such as field-effect transistors, bipolar transistors, metal-oxide-semiconductor transistors, diodes, resistors, capacitors, inductors, etc., forming analog and/or digital circuits. The peaking amplifiers can be formed upon or within a semiconductor substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings provided above, one of ordinary skill in the art will be able to contemplate other implementations and applications of the techniques of described herein.

The terminology used herein is for the purpose of describing particular example embodiments only and is not intended to be limiting. As used herein, the singular forms "a," "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate, for example +/−10% of the stated value(s).

Spatially relative terms, such as "inner," "outer," "beneath," "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to an individual in the art are included within the scope of the disclosure as defined by the accompanying claims.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A peaking amplifier circuit, comprising:
   an input node, an output node, and a feedback node;
   a first input amplifier having an input connected to the input node and an output connected to the feedback node;
   a second input amplifier having an input connected to the input node;
   a coupling capacitor connected between an output of the second input amplifier and the feedback node;
   an amplifier having an input connected to the feedback node and an output connected to the output node;
   a feedback circuit including:
      a base feedback amplifier having an input connected to the output node and an output connected to the feedback node; and
      a tunable feedback amplifier having an input connected to the output node and an output connected to the feedback node;
   and
   a tuning circuit for varying a transconductance of the feedback circuit to adjust an operational frequency of the peaking amplifier circuit.

2. The peaking amplifier circuit of claim 1, wherein the feedback circuit further includes:
   a feedback coupling capacitor connected between the output of the tunable feedback amplifier and the feedback node; and
   a load impedance connected to the output of the tunable feedback amplifier.

3. The peaking amplifier circuit of claim 2, wherein the base feedback amplifier, the tunable feedback amplifier, the feedback coupling capacitor, and the load impedance cooperate to reduce a variation in DC gain at different operational frequencies of the peaking amplifier circuit.

4. The peaking amplifier circuit of claim 1, wherein the tuning circuit applies a tuning voltage to the tunable feedback amplifier, the tuning voltage varying a transconductance of the tunable feedback amplifier and adjusting the operational frequency of the peaking amplifier circuit.

5. The peaking amplifier circuit of claim 4, wherein the tuning circuit applies the tuning voltage to a gate of a tail transistor in the tunable feedback amplifier.

6. The peaking amplifier circuit of claim 1, wherein the tuning circuit selectively activates or deactivates the tunable feedback amplifier to vary the transconductance of the tunable feedback amplifier and adjust the operational frequency of the peaking amplifier circuit.

7. The peaking amplifier circuit of claim 6, wherein the tuning circuit applies a tuning voltage to a gate of a tail transistor of the tunable feedback amplifier to selectively activate or deactivate the tunable feedback amplifier and adjust the operational frequency of the peaking amplifier circuit.

8. The peaking amplifier circuit of claim 1, further comprising an integrated circuit including the peaking amplifier circuit.

9. A peaking amplifier circuit, comprising:
an input node, an output node, and a feedback node;
a first input amplifier having an input connected to the input node and an output connected to the feedback node;
a second input amplifier having an input connected to the input node;
a coupling capacitor connected between an output of the second input amplifier and the feedback node;
an amplifier having an input connected to the feedback node and an output connected to the output node;
a feedback circuit including:
a base feedback amplifier having an input connected to the output node and an output connected to the feedback node; and
a tunable feedback amplifier having an input connected to the output node and an output connected to the output of the second input amplifier;
and
a tuning circuit for varying a transconductance of the feedback circuit to adjust an operational frequency of the peaking amplifier circuit.

10. The peaking amplifier circuit of claim 9, wherein the feedback circuit further includes a load impedance connected to the feedback node and a load impedance connected to the output of the second input amplifier.

11. The peaking amplifier circuit of claim 9, wherein the base feedback amplifier, the tunable feedback amplifier, and the coupling capacitor cooperate to reduce a variation in DC gain at different operational frequencies of the peaking amplifier circuit.

12. The peaking amplifier circuit of claim 9, wherein the tuning circuit applies a tuning voltage to the tunable feedback amplifier, the tuning voltage varying a transconductance of the tunable feedback amplifier and adjusting the operational frequency of the peaking amplifier circuit.

13. The peaking amplifier circuit of claim 12, wherein the tuning circuit applies the tuning voltage to a gate of a tail transistor in the tunable feedback amplifier.

14. The peaking amplifier circuit of claim 9, wherein the tuning circuit selectively activates or deactivates the tunable feedback amplifier to vary the transconductance of the tunable feedback amplifier and adjust the operational frequency of the peaking amplifier circuit.

15. The peaking amplifier circuit of claim 14, wherein the tuning circuit applies a tuning voltage to a gate of a tail transistor of the tunable feedback amplifier to selectively activate or deactivate the tunable feedback amplifier and adjust the operational frequency of the peaking amplifier circuit.

16. The peaking amplifier circuit of claim 9, further comprising an integrated circuit including the peaking amplifier circuit.

17. A method, comprising:
adjusting a transconductance of a feedback circuit of a peaking amplifier;
adjusting an operational frequency of the peaking amplifier in response to the adjustment of the transconductance of the feedback circuit; and
reducing a variation in DC gain attenuation at different operational frequencies of the peaking amplifier,
wherein the feedback circuit includes a feedback amplifier, and wherein adjusting the transconductance of the feedback circuit includes applying a tuning voltage to the feedback amplifier, the tuning voltage varying a transconductance of the feedback amplifier and causing an adjustment of the operational frequency of the peaking amplifier.

18. The method of claim 17, wherein applying the tuning voltage includes applying the tuning voltage to a gate of a tail transistor in the feedback amplifier.

19. The method of claim 17, wherein adjusting the transconductance of the feedback circuit further includes selectively activating or deactivating the feedback amplifier to vary the transconductance of the feedback.

* * * * *